US007515779B2

(12) United States Patent
Ishikawa

(10) Patent No.: US 7,515,779 B2
(45) Date of Patent: Apr. 7, 2009

(54) OPTICAL SEMICONDUCTOR DEVICE

(75) Inventor: Tsutomu Ishikawa, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 0 days.

(21) Appl. No.: 11/727,959

(22) Filed: Mar. 29, 2007

(65) Prior Publication Data

US 2007/0230522 A1 Oct. 4, 2007

(30) Foreign Application Priority Data

Mar. 30, 2006 (JP) .............................. 2006-096163

(51) Int. Cl.
  *G02F 1/295* (2006.01)
  *G02F 1/01* (2006.01)
  *G02F 1/035* (2006.01)
  *G02B 6/26* (2006.01)
  *G02B 6/42* (2006.01)

(52) U.S. Cl. ................... 385/5; 385/1; 385/2; 385/4; 385/8; 385/31; 385/39; 385/40; 385/41; 385/42; 385/49

(58) Field of Classification Search ............... 385/4, 385/5
See application file for complete search history.

(56) References Cited

U.S. PATENT DOCUMENTS

| 4,859,876 | A | * | 8/1989 | Dirk et al. ............... 359/245 |
| 5,333,231 | A | * | 7/1994 | Fukuda et al. ............ 385/122 |
| 5,388,001 | A | * | 2/1995 | Okayama et al. .......... 359/629 |
| 5,481,636 | A | * | 1/1996 | Fukuda et al. ............ 385/122 |
| 5,852,702 | A | * | 12/1998 | Nishida et al. ............ 385/130 |
| 5,854,870 | A | * | 12/1998 | Helmfrid et al. .......... 385/122 |
| 5,949,925 | A | * | 9/1999 | Seino ........................... 385/1 |
| 6,215,918 | B1 | * | 4/2001 | Keil et al. .................... 385/16 |
| 6,643,430 | B2 | * | 11/2003 | Matsumoto et al. ......... 385/37 |
| 6,700,910 | B1 | | 3/2004 | Aoki et al. |
| 7,006,733 | B2 | * | 2/2006 | Galstian et al. ............. 385/37 |
| 2004/0062481 | A1 | | 4/2004 | Dieckroger |
| 2004/0218639 | A1 | | 11/2004 | Oh et al. |
| 2006/0280397 | A1 | * | 12/2006 | Matsumoto et al. ........... 385/5 |

FOREIGN PATENT DOCUMENTS

| JP | 8043777 A | 2/1996 |
| JP | 9-92934 A | 4/1997 |

OTHER PUBLICATIONS

European Search Report for EP 07 10 4936 mailed on Jul. 30, 2007.

* cited by examiner

*Primary Examiner*—Frank G Font
*Assistant Examiner*—Ryan Lepisto
(74) *Attorney, Agent, or Firm*—Westerman, Hattori, Daniels & Adrian, LLP.

(57) ABSTRACT

An optical semiconductor device has a heater, an optical waveguide layer, a first electrode and a second electrode. The heater is provided on a first semiconductor region and has more than one heater segment coupled or separated to each other. The optical waveguide layer is provided in the first semiconductor region and receives heat from the heater. The first electrode is coupled to a connecting point of the heater segments adjacent to each other. The second electrodes are electrically common and are coupled to other ends of the heater segments in opposite side of the connecting point respectively.

13 Claims, 8 Drawing Sheets

OPTICAL SEMICONDUCTOR DEVICE

BACKGROUND OF THE INVENTION

1. Field of the Invention

This invention generally relates to an optical semiconductor device.

2. Description of the Related Art

Generally, a wavelength-tunable semiconductor laser has a gain for a laser emission and can select a wavelength of the laser light. There are some methods of selecting a wavelength. For example, the methods include a method of changing a resonant wavelength of loss or gain by changing a refractive index or angle of a diffractive grating or an etalon provided in a laser cavity. And the methods include a method of changing a resonant wavelength of the laser cavity by changing an optical length in the laser cavity (refractive index or a physical length of the laser cavity).

The method of changing the refractive index has an advantage in reliability or manufacturing cost, because a mechanical operating portion is not necessary being different from the method of changing the angle or length. The refractive index changing method includes changing a temperature of an optical waveguide, changing a carrier density in the optical waveguide by providing a current, and so on. A semiconductor laser having a Sampled Grating Distributed Reflector (SG-DR) is supposed as a wavelength tunable laser that changes a temperature of an optical waveguide, where the SG-DR has a wavelength selection function.

In this semiconductor laser, if a reflection spectrum of a plurality of SG-DR regions (reflection region) is controlled preferably, a predetermined wavelength can be selected with a vernier effect. That is, this semiconductor laser emits a laser light at a wavelength where reflection peaks of two SG-DR regions are overlapped with each other. It is therefore possible to control the lasing wavelength by controlling each of the reflection peaks of the SG-DR regions.

Generally, a heater is provided on a surface of the SG-DR region. The temperature of the optical waveguide of the SG-DR region is changed when the heater generates heat. As a result, the refractive index of the SG-DR region changes. It is therefore possible to control the reflection peak wavelength of the SG-DR region by controlling the heating value of the heater. The heater needs an electrical power when generating heat. And so, Japanese Patent Application Publication No. 9-92934 discloses a method of controlling a refractive index of a reflection region by providing an electrical power to a heater.

Here, a wavelength controllable range of the reflection peak is proportional to an amount of refractive index change of the optical waveguide, that is, an amount of temperature change of the optical waveguide. It is necessary to enlarge the voltage to be applied to the heater in order to enlarge the wavelength controllable range. However, it is preferable that the semiconductor laser is controlled with low electrical power, from a viewpoint of a drive circuit design. It is therefore difficult for the heater to generate sufficient heat which enlarges the wavelength controllable range of the semiconductor laser.

On the other hand, the heater may be divided into heaters, the heaters may be connected in parallel and the electrical resistance of the heater may be reduced. Generally, provided electrical power P has a relationship with a resistance R of the heater and the applied voltage V, and is shown as $P=V^2/R$. And it is possible to enlarge the provided electrical power with the same voltage, when the electrical resistance R is reduced. However, in this case, a process of manufacturing a refined heater and an electrode coupled to the heater is complicated, and a cost is increased. In addition, if the number of the electrode is increased, a heat radiation through the electrode to outside of the optical waveguide is increased. Then, the amount of the temperature change, that is, the efficiency of the heater, is reduced even if the same electrical power is provided.

SUMMARY OF THE INVENTION

The present invention provides an optical semiconductor device in which a heater can generate sufficient heat with low voltage and can reduce heat radiation from an electrode.

According to an aspect of the present invention, preferably, there is provided an optical semiconductor device including a heater, an optical waveguide layer, a first electrode and second electrodes. The heater is provided on a first semiconductor region and has more than one heater segment coupled or separated to each other. The optical waveguide layer is provided in the first semiconductor region and receives heat from the heater. The first electrode is coupled to a connecting point of the heater segments adjacent to each other. The second electrodes are electrically common and are coupled to other ends of the heater segments in opposite side of the connecting point respectively.

With the above-mentioned configuration, the heater segments are coupled in parallel, because the second electrodes are coupled to the heater in common. And an electrical resistance from the first electrode to the second electrode is reduced. In this case, the heater can generate heat sufficiently with small voltage, compared to a case where a voltage is applied to one end of the heater and the other end is earthed. It is therefore not necessary to provide a voltage raising circuit. It is possible to prevent a failure of the voltage applied to the heater. And it is possible to control the heating value of the heater effectively. It is therefore possible to control the temperature of the optical waveguide layer effectively.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1:
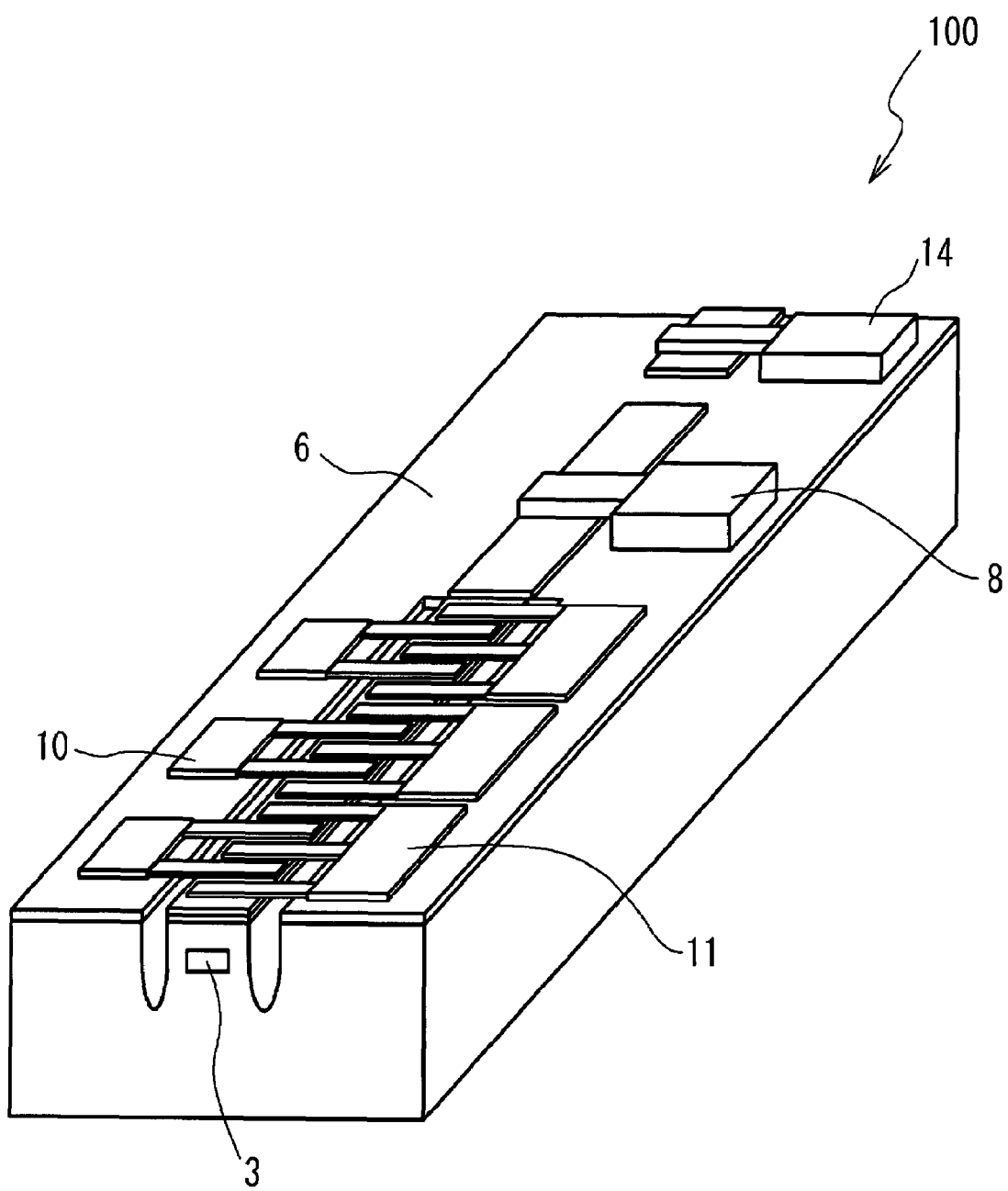
FIG. 1 illustrates a perspective view of a laser chip in accordance with a first embodiment of the present invention.
Figure 2A:
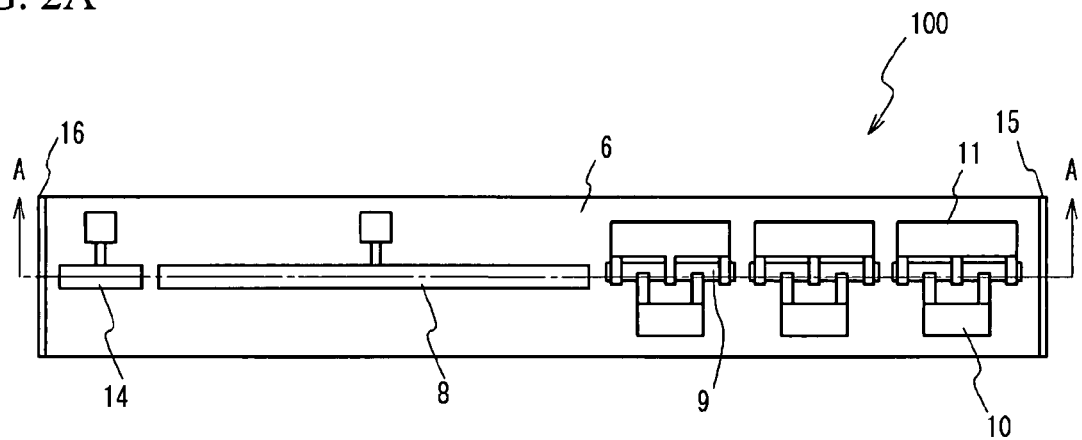
FIG. 2A and FIG. 2B illustrate a top view and a cross sectional view of a laser chip in accordance with a first embodiment of the present invention.
Figure 2B:
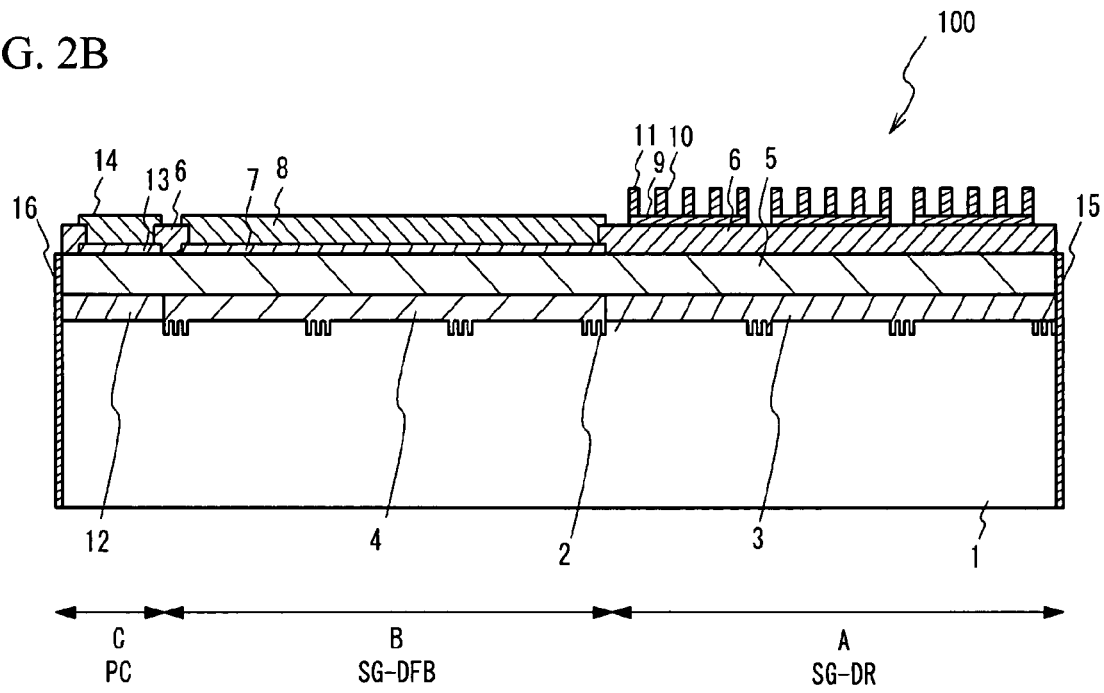

FIG. 1 illustrates a perspective view of a laser chip 100 in accordance with a first embodiment of the present invention. FIG. 2A illustrates a top view of the laser chip 100. FIG. 2B illustrates a cross sectional view taken along a line A-A of FIG. 2A. A description will be given of the laser chip 100 with reference to FIG. 1, FIG. 2A and FIG. 2B.

As shown in FIG. 1, FIG. 2A and FIG. 2B, the laser chip 100 has a structure in which a Sampled Grating Distributed Reflector (SG-DR) region A, a Sampled Grating Distributed Feedback Laser (SG-DFB) region B and a Power Control (PC) region C are coupled in order.

The SG-DR region A has a structure in which an optical waveguide 3, a cladding layer 5 and an insulating layer 6 are laminated on a substrate 1 in order and thin film resistors 9, power electrodes 10 and ground electrodes 11 are laminated on the insulating layer 6. The SG-DFB region B has a structure in which an optical waveguide 4, the cladding layer 5, a contact layer 7 and an electrode 8 are laminated on the substrate 1 in order. The PC region C has a structure in which an optical waveguide 12, the cladding layer 5, a contact layer 13 and an electrode 14 are laminated on the substrate 1 in order. The substrate 1 and the cladding layer 5 of the SG-DR region A, the SG-DFB region B and the PC region C are a single layer formed as a unit respectively. The optical waveguides 3, 4 and 12 are formed on a same plane and are optically coupled.

A low reflecting coating 15 is formed on end facet of the substrate 1, the optical waveguide 3 and the cladding layer 5 at the SG-DR region A side. On the other hand, a low reflecting coating 16 is formed on end facet of the substrate 1, the optical waveguide 12 and the cladding layer 5 at the PC region C side. Diffractive gratings 2 are formed at a given interval in the optical waveguides 3 and 4. The sampled grating is thus formed. The insulating layer 6 is further formed between the electrode 8 and the electrode 14.

The substrate 1 is, for example, a semiconductor substrate composed of InP. The optical waveguide 3 is, for example, composed of InGaAsP crystal having an absorption edge wavelength at shorter wavelength side compared to the lasing wavelength. PL wavelength of the optical waveguide 3 is approximately 1.3 μm. The optical waveguide 4 is, for example, an active layer composed of InGaAsP crystal amplifying a light of a desirable wavelength of a laser emission. The PL wavelength of the optical waveguide 4 is approximately 1.57 μm. The optical waveguide 12 is, for example, composed of InGaAsP crystal for changing the output power of the emitted light by absorbing or amplifying a light. The PL wavelength of the optical waveguide 12 is approximately 1.57 μm.

SG-DR optical waveguide segments are formed in the optical waveguide 3. Three SG-DR optical waveguide segments are formed in the optical waveguide 3 in the embodiment. Here, the SG-DR optical waveguide segment is a region in which one region having the diffractive grating 2 and one space region not having the diffractive grating 2 are combined in the optical waveguide 3.

The cladding layer 5 is composed of InP and confines a laser light traveling in the optical waveguides 3, 4 and 12. The contact layers 7 and 13 are composed of InGaAsP crystal. The insulating layer 6 is a passivation film composed of an insulator such as SiN. The low reflecting coatings 15 and 16 are, for example, composed of a dielectric film including $MgF_2$ and TiON. The reflectivity of the low reflecting coatings 15 and 16 are, for example, less than 0.3%.

The thin film resistor 9 is composed of such as NiCr. Each of the thin film resistors 9 is formed on the insulating layer 6 above each of the SG-DR optical waveguide segments respectively. Accordingly, the number of the thin film resistor 9 is three in this case. One of the power electrodes 10 and one of the ground electrodes 11 are coupled to each of the thin film resistors 9. The power electrode 10, the ground electrode 11, the electrode 8 and the electrode 14 are composed of a conductive material such as Au. As shown in FIG. 1, a mesa groove is formed from both sides of the thin film resistor 9 to both sides of the optical waveguide 3. The mesa groove is formed to be parallel to the optical waveguide 3. In this case, heat is conducted from the thin film resistor 9 to the optical waveguide 3 effectively, because thermal conductivity of air is lower than that of the cladding layer 5.

Next, a description will be given of an operation of the laser chip 100. At first, a given current is provided to the electrode 8. And a light is generated in the optical waveguide 4. The light propagates in the optical waveguides 3 and 4, and is reflected and amplified repeatedly. Then, it causes lasing oscillation. A part of the laser light is amplified or absorbed in the optical waveguide 12 and is emitted through the low reflecting coating 16. It is possible to control the gain or the absorptance of the optical waveguide 12 with the current provided to the electrode 14. The output power of the laser light is kept constant when a given current is provided to the electrode 14.

Figure 3A:
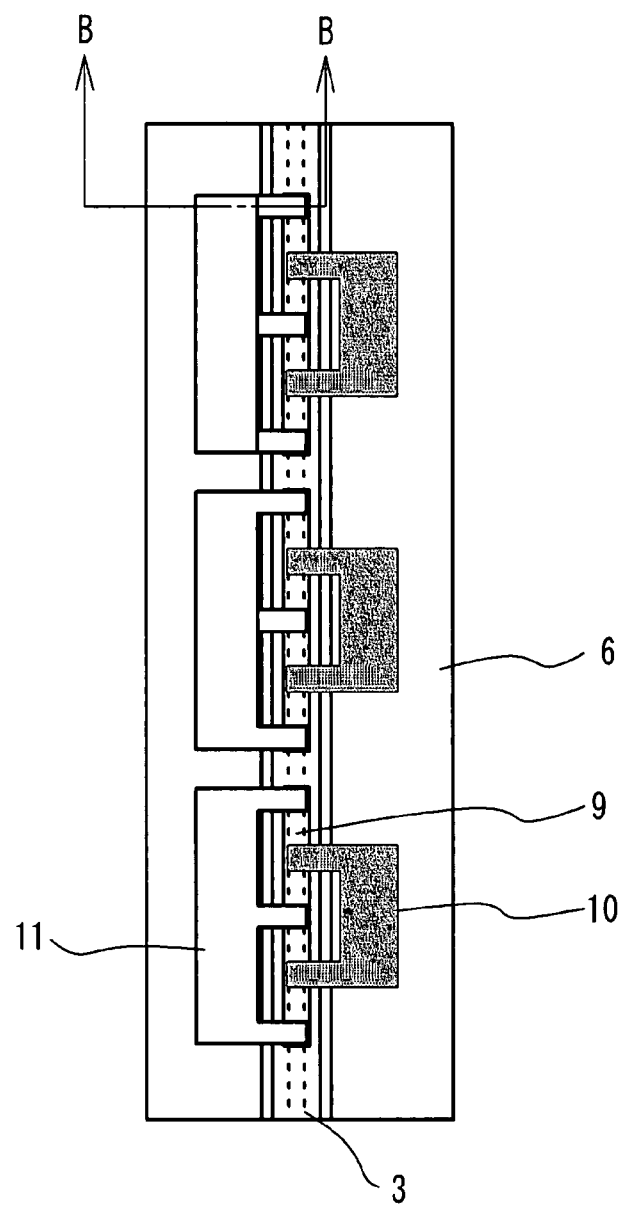
FIG. 3A and FIG. 3B illustrate a top view and a cross sectional view of a SG-DR region in accordance with a first embodiment.
Figure 3B:
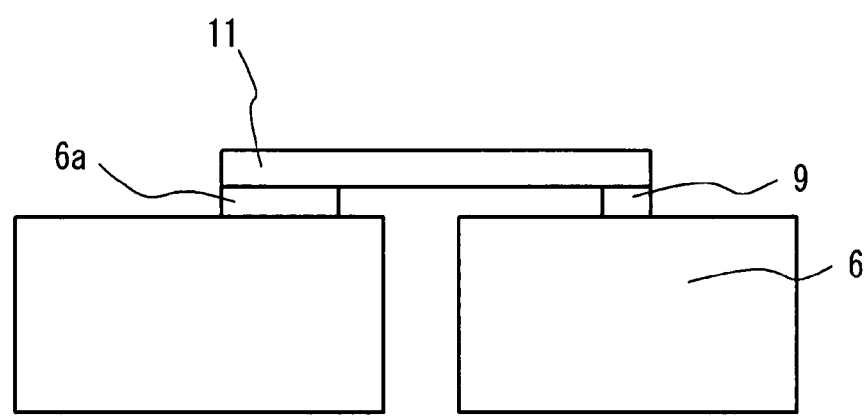

Next, a description will be given of the thin film resistor 9, the power electrode 10 and the ground electrode 11 in detail. FIG. 3A illustrates an enlarged top view of the SG-DR region A. FIG. 3B illustrates a cross sectional view taken along a line B-B of FIG. 3A. As shown in FIG. 3A, each thin film resistor 9 is arranged in a line at an interval above the optical waveguide 3.

The power electrode 10 and the ground electrode 11 are a comb electrode having comb teeth. The power electrode 10 has two comb teeth. The ground electrode 11 has three comb teeth. Each of the comb teeth of the ground electrode 11 is coupled to both ends and a center of each thin film resistor 9 respectively. Each of the comb teeth of the power electrode 10 is coupled to the thin film resistor 9 between each of the comb teeth of the ground electrode 11.

The comb tooth of the power electrode 10 and the comb tooth of the ground electrode 11 are coupled to the thin film resistor 9 alternately in a longitudinal direction of the thin film resistor 9. That is, the thin film resistor 9 is substantially divided. In the embodiment, the thin film resistor 9 is divided into four resistors. An electrical resistance from the power electrode 10 to the ground electrode 11 is reduced.

In this case, the thin film resistor 9 can generate heat sufficiently with small voltage. And it is possible to reduce a voltage to be applied to the thin film resistor 9, compared to a case where a voltage is applied to one end of the thin film resistor 9 and the other end is grounded. It is therefore not necessary to provide a voltage raising circuit. It is possible to prevent a lack of the voltage applied to the thin film resistor 9. And it is possible to control the heat quantity of the thin film resistor 9 effectively. It is therefore possible to control the temperature of the optical waveguide 3 effectively. And the control accuracy of the emitted wavelength on the laser chip 100 is improved.

In the embodiment, the number of the comb teeth coupled to the thin film resistor 9 is reduced, although the thin film resistor 9 is substantially divided into four resistors. Generally, one ground electrode and one power electrode are necessary for one thin film resistor. And eight electrodes are necessary for four thin film resistors. However, the number of the comb electrodes coupled to the thin film resistor 9 is five in the embodiment. It is because that each comb electrode is coupled to two adjacent thin film resistors 9 in common. In this case, it is possible to restrain a heat radiation from the comb teeth. And it is not necessary to provide a small size thin film resistor, because one thin film resistor is divided in the embodiment. Therefore, it is not necessary to improve the manufacturing accuracy of the thin film resistor excessively.

In the embodiment, the length of the optical waveguide 3 is approximately 1200 μm. The length of the thin film resistor 9 in the length direction of the optical waveguide 3 is approximately 370 μm. An interval between the comb tooth of the power electrode 10 and the comb tooth of the ground electrode 11 is approximately 80 μm. The length of the laser chip 100 is approximately 3000 μm.

A main body of the power electrode 10 and a main body of the ground electrode 11 is away from the thin film resistor 9 by approximately 30 μm. The main body is a part where the comb tooth is not provided. The width of the comb tooth of the power electrode 10 and the ground electrode 11 is approximately 10 μm. The thickness of the power electrode 10 and the ground electrode 11 is approximately 3 μm. In this case, the cross sectional area of the comb tooth is small, because the width and the thickness of the comb tooth is small. And it is possible to restrain the heat radiation through the comb tooth, because the distance from the main body of the power electrode 10 and the ground electrode 11 to the thin film resistor 9 is large. It is therefore possible to restrain the heat radiation from the power electrode 10 and the ground electrode 11.

As shown in FIG. 3B, an insulating layer 6a is formed between the main body of the power electrode 10 and the insulating layer 6 and between the main body of the ground electrode 11 and the insulating layer 6. The insulating layer 6a is composed of a material having a thermal conductivity lower than that of the insulating layer 6. The insulating layer 6a is, for example, composed of an insulator such as silicon oxide. It is therefore possible to restrain the heat radiation from the main body of the power electrode 10 and the main body of the ground electrode 11.

Each comb tooth of the power electrode 10 and each comb tooth of the ground electrode 11 have an air bridge structure in which the comb tooth is coupled to the thin film resistor 9 without contacting to the insulating layer 6. It is possible to restrain the heat radiation from the comb tooth of the power electrode 10 and the comb tooth of the ground electrode 11, because the heat conductivity of air is lower than that of the insulating layer 6. It is therefore possible to control the refractive index of each SG-DR segment without an excessive consumption of electrical power. And the controlling accuracy of the refractive index of each SG-DR segment is improved. It is possible to form the air bridge structure with patterning method.

In the embodiment, the SG-DR region A corresponds to the optical semiconductor device. The optical waveguide 3 corresponds to the optical waveguide layer. The thin film resistor 9 corresponds to the heater. One of the comb tooth of the power electrode 10 and the comb tooth of the ground electrode 11 corresponds to the first electrode or the third electrode, and the other corresponds to the second electrode. A region in the thin film resistor 9 from the comb tooth of the power electrode 10 to the comb tooth of the ground electrode 11 corresponds to the heater segment.

Second Embodiment

Figure 4:
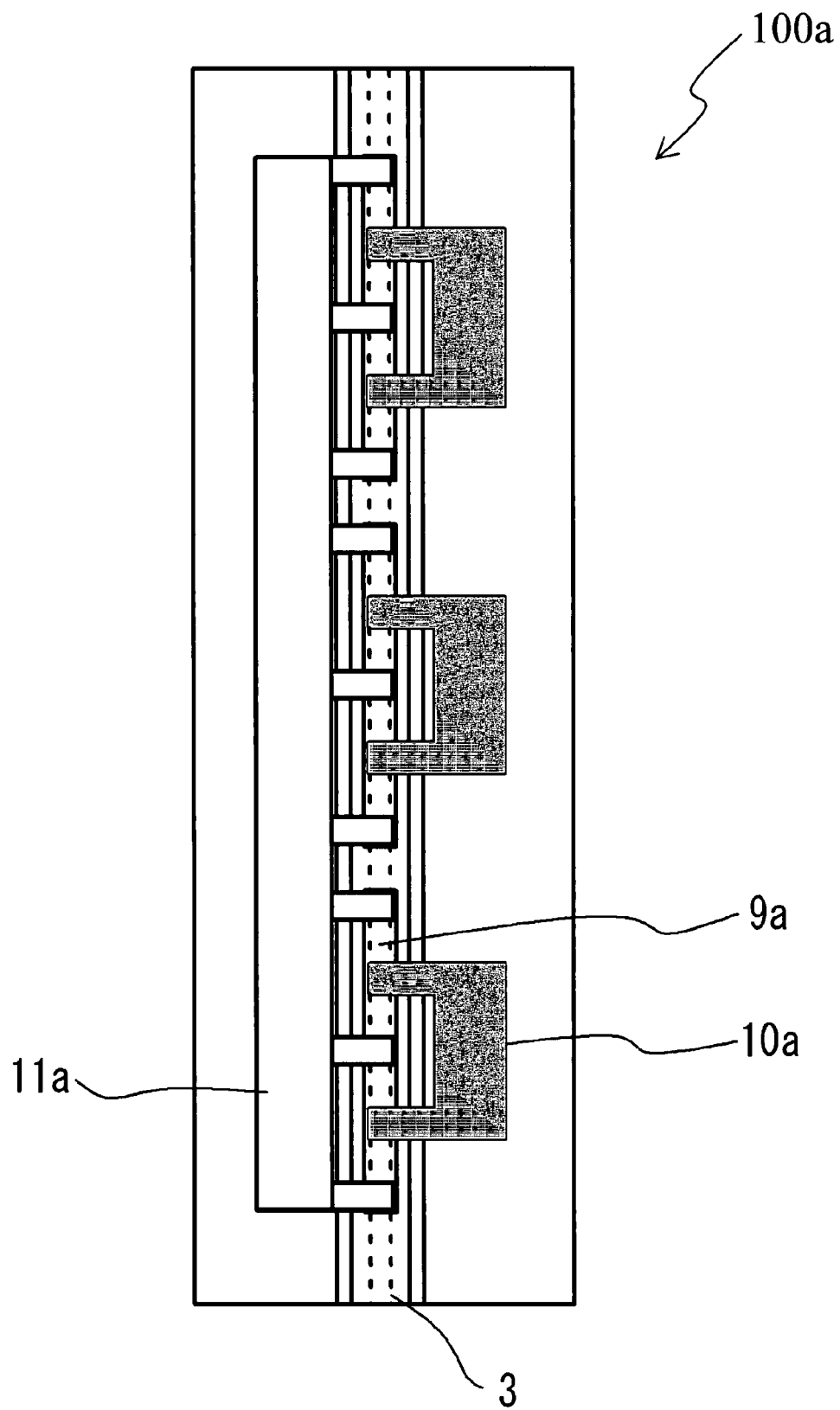
FIG. 4 illustrates an enlarged top view of a SG-DR region in accordance with a second embodiment.

A description will be given of a semiconductor region 100a in accordance with a second embodiment of the present invention. The semiconductor region 100a has a ground electrode 11a instead of the ground electrode 11, being different from the laser chip 100 shown in FIG. 1. A description will be given of details of the ground electrode 11a. An explanation of other structure is omitted. FIG. 4 illustrates an enlarged top view of the SG-DR region A in accordance with the second embodiment. As shown in FIG. 4, one ground electrode 11a is connected to the other adjacent ground electrode 11a. The semiconductor region 100a has a thin film resistor 9a instead of the thin film resistor 9. The thin film resistor 9a has the same structure as the thin film resistor 9. In this case, the number of the ground electrode is one. A power electrode 10a is the same as the power electrode 10 shown in FIG. 2.

Third Embodiment

A description will be given of a semiconductor region 100b in accordance with a third embodiment of the present invention. The semiconductor region 100b has a thin film resistor 9b instead of the thin film resistor 9 and has a ground electrode 11b instead of the ground electrode 11, being different from the laser chip 100 shown in FIG. 1. A description will be given of details of the thin film resistor 9b and the ground electrode 11b. An explanation of other structure is omitted. A power electrode 10b shown in FIG. 5 is the same as the power electrode 10 shown in FIG. 2.

Figure 5:
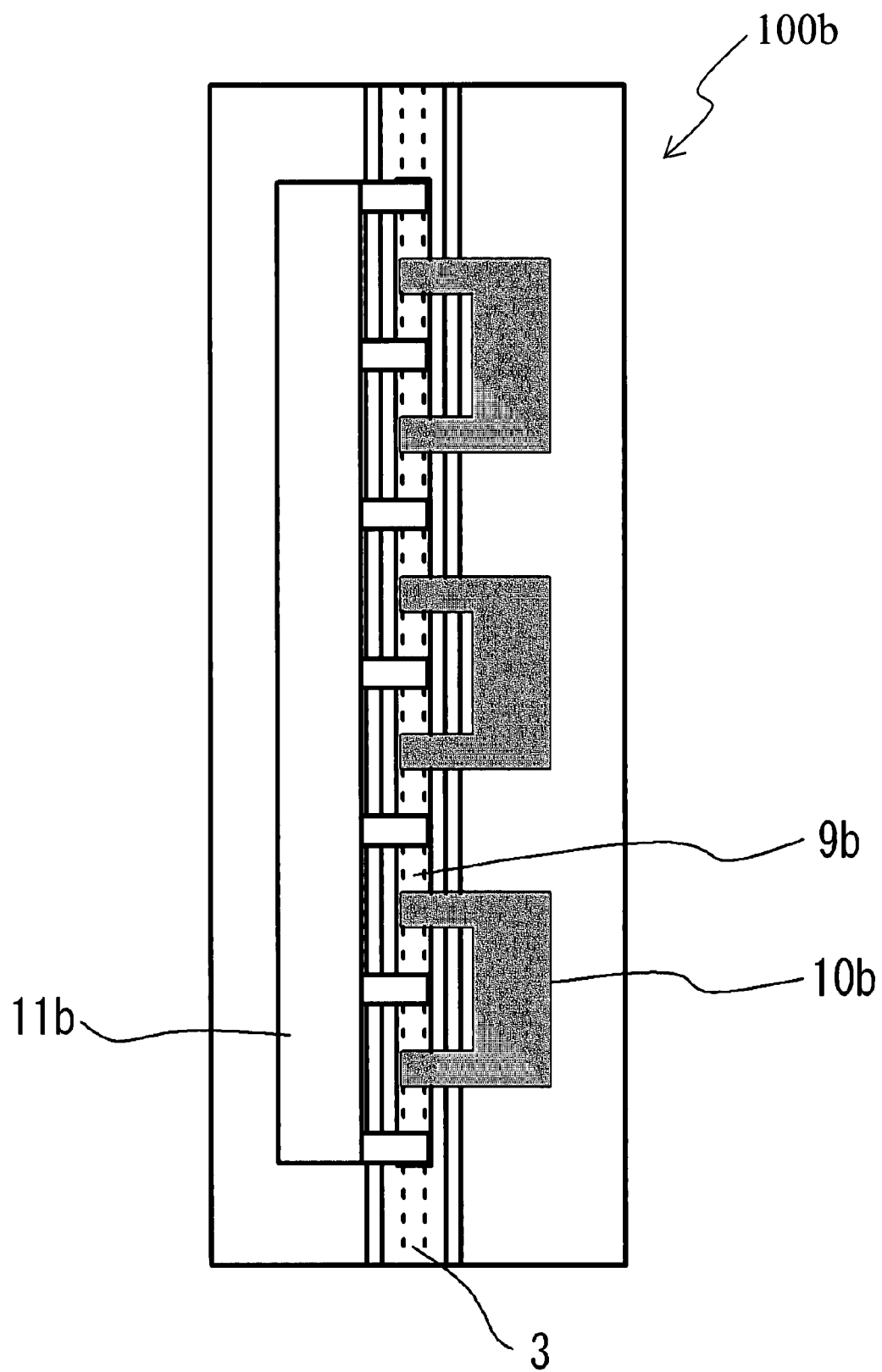
FIG. 5 illustrates an enlarged top view of a SG-DR region in accordance with a third embodiment.

FIG. 5 illustrates an enlarged top view of the SG-DR region A in accordance with the third embodiment. As shown in FIG. 5, the thin film resistor 9b extends across more than one SG-DR optical waveguide segment. That is, the thin film resistor 9b has a structure in which more than one thin film resistor 9 is connected to each other. The ground electrode 11b is a comb electrode having more than one comb tooth between one end of the thin film resistor 9b and the other end. In the embodiment, the ground electrode 11b has seven comb teeth. Each of the comb teeth of the power electrode 10b is coupled to the thin film resistor 9b between each of the comb teeth of the power electrode 11b. In the embodiment, the temperature of one SG-DR optical waveguide segment is controlled with two comb teeth of the power electrode 10 and three comb teeth of the ground electrode 11b adjacent to those.

In the embodiment, the same effect as the first and the second embodiment is obtained, when only one thin film resistor is provided. In this case, it is not necessary to consider the alignment accuracy of more than one thin film resistor. It is not necessary to improve the manufacturing accuracy of the thin film resistor. The ground electrode 11b has a structure in which adjacent comb teeth of the adjacent ground electrodes 11 are connected into one comb tooth. And the number of the comb teeth is reduced, compared to the first embodiment. It is therefore possible to restrain the heat radiation from the comb tooth. And the number of a ground terminal may be one.

Fourth Embodiment

A description will be given of a semiconductor region 100c in accordance with a fourth embodiment of the present invention. The semiconductor region 100*c* has a thin film resistor 9*c* instead of the thin film resistor 9, has a power electrode 10*c* instead of the power electrode 10 and has a ground electrode 11*c* instead of the ground electrode 11, being different from the laser chip 100 shown in FIG. 1. A description will be given of details of the thin film resistor 9*c*, the power electrode 10*c* and the ground electrode 11*c*. An explanation of other structure is omitted.

Figure 6:
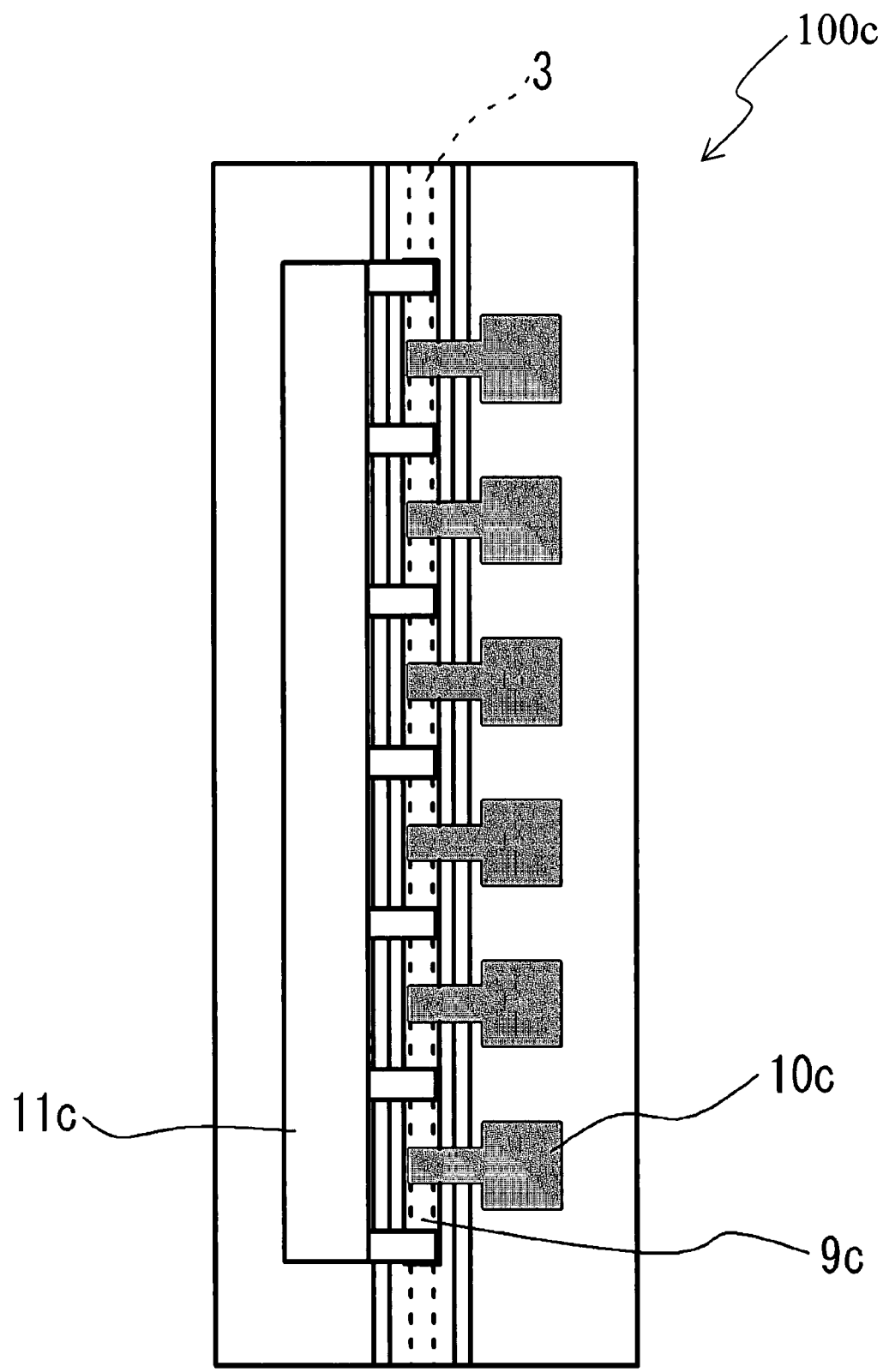
FIG. 6 illustrates an enlarged top view of a SG-DR region in accordance with a fourth embodiment.

FIG. 6 illustrates an enlarged top view of the SG-DR region A in accordance with the fourth embodiment. As shown in FIG. 6, the thin film resistor 9*c* has the same structure as the thin film resistor 9*b* shown in FIG. 5. The ground electrode 11*c* has the same structure as the ground electrode 11*b* shown in FIG. 5. Each power electrode 10*c* has one terminal. The terminal of the power electrode 10*c* is coupled to the thin film resistor 9*c* between two adjacent comb teeth of the ground electrode 11*c*.

As mentioned above, the power electrode 10*c* and the ground electrode 11*c* are alternately coupled to one ground electrode and the other in the thin film resistor 9*c*. The thin film resistor 9*c* is therefore substantially divided. And it is possible to reduce the voltage to be applied to the thin film resistor 9*c*. The temperature of one SG-DR segment may be controlled with one of the power electrodes 10*c* and two comb teeth of the ground electrode 11*c* adjacent to the power electrode 10*c*. The temperature of one SG-DR segment may be controlled with two of the power electrodes 10*c* and three of the comb teeth of the ground electrodes 11*c* adjacent to the power electrodes 10*c*. In the embodiment, the interval between the terminal of the power electrode 10*c* and the comb tooth of the ground electrode 11*c* is approximately 100 μm.

Fifth Embodiment

A description will be given of a semiconductor region 100*d* in accordance with a fifth embodiment of the present invention. The semiconductor region 100*d* has a thin film resistor 9*d* instead of the thin film resistor 9, has a power electrode 10*d* instead of the power electrode 10 and has a ground electrode 11*d* instead of the ground electrode 11, being different from the laser chip 100 shown in FIG. 1. A description will be given of details of the thin film resistor 9*d*, the power electrode 10*d* and the ground electrode 11*d*. An explanation of other structure is omitted.

Figure 7A:
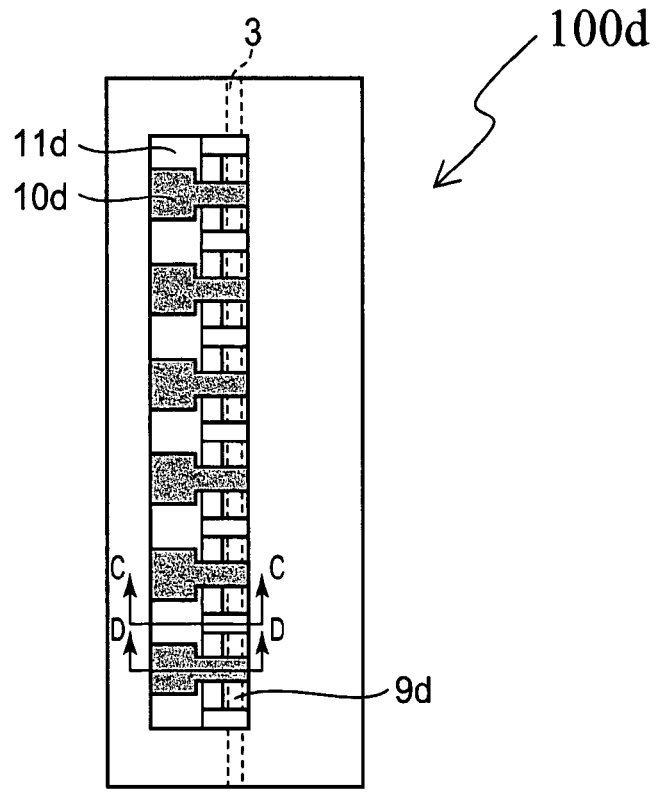
FIG. 7A through FIG. 7C illustrate a top view and a cross sectional view of a SG-DR region in accordance with a fifth embodiment.
Figure 7B:
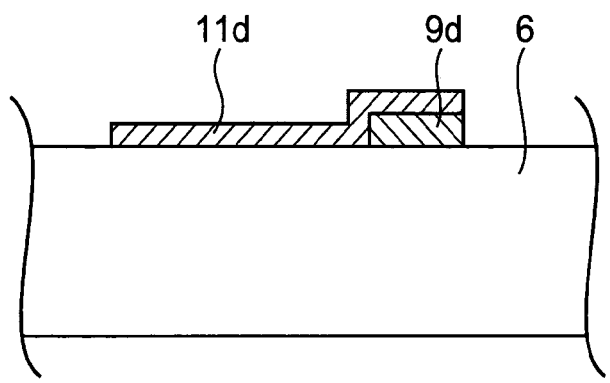
Figure 7C:
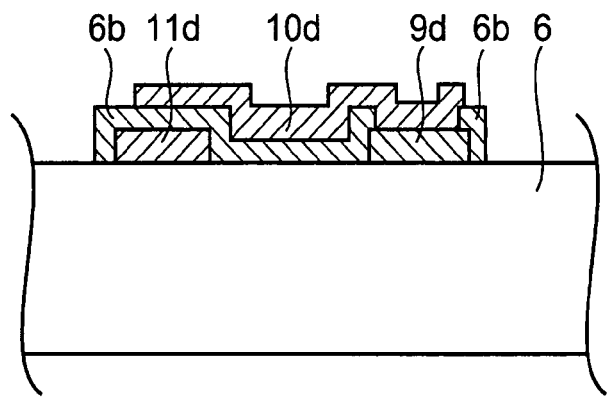

FIG. 7A illustrates an enlarged top view of the SG-DR region A in accordance with the fifth embodiment. FIG. 7B illustrates a cross sectional view taken along a line C-C of FIG. 7A. FIG. 7C illustrates a cross sectional view taken along a line D-D of FIG. 7A. As shown in FIG. 7A, the thin film resistor 9*d* has the same shape as the thin film resistor 9*c* shown in FIG. 6. The ground electrode 11*d* has the same shape as the ground electrode 11*c* shown in FIG. 6. However, the power electrode 10*d* is arranged on the ground electrode 11*d*. A terminal of each power electrode 10*d* is coupled to the thin film resistor 9*d* between two adjacent comb teeth of the ground electrode 11*d*.

As shown in FIG. 7C, an insulating layer 6*b* is formed between the power electrode 10*d* and the ground electrode 11*d*. And it is possible to prevent electrical short between the power electrode 10*d* and the ground electrode 11*d*.

As mentioned above, the power electrode 10*d* and the ground electrode 11*d* are arranged at a one side of the thin film resistor 9*d*. In this case, it is possible to make effective use of the other side of the thin film resistor 9*d*. In addition, the ground electrode 11*d* may be arranged on the power electrode 10*d*, although the power electrode 10*d* is arranged on the ground electrode 11*d* in the embodiment.

Sixth Embodiment

Figure 8:
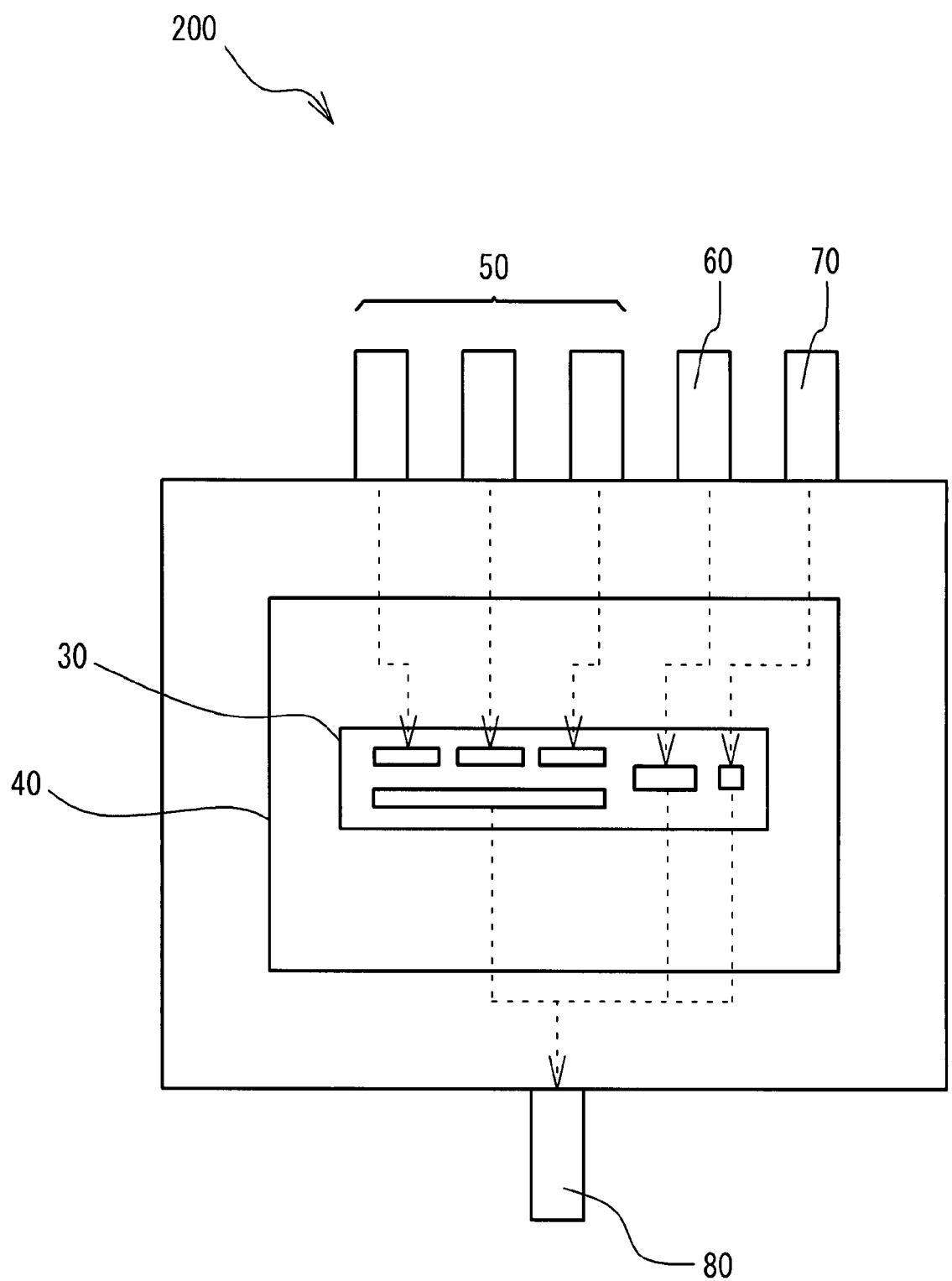
FIG. 8 illustrates an overall view of a laser module in accordance with a sixth embodiment.

A description will be given of a laser module 200 in accordance with a sixth embodiment of the present invention. FIG. 8 illustrates an overall view of the laser module 200. As shown in FIG. 8, the laser module 200 has a laser chip 30, a temperature control device 40, a heater power terminal portion 50, a gain power terminal 60, a PC power terminal 70 and a ground terminal 80. The laser chip 30 is arranged on the temperature control device 40. The laser chip 30 is one of the semiconductor regions 100 or 100*a* through 100*d*.

The temperature control device 40 controls the temperature of the laser chip 30. And the temperature control device 40 can control the reflection peak wavelength of the optical waveguide 4. The heater power terminal portion 50 has more than one terminal. Each of the terminals of the heater power terminal portion 50 is coupled to each of the power electrodes 10 and 10*a* through 10*d*. It is therefore possible to apply a voltage to the power electrodes 10 and 10*a* through 10*d* separately. It is possible to control the temperature of the SG-DR segments separately. The gain power terminal 60 is coupled to the electrode 8 shown in FIG. 2. The PC power terminal 70 is coupled to the electrode 14 shown in FIG. 2.

The ground terminal 80 is reference potential terminal. The ground terminal 80 is coupled to the ground electrodes 11 and 11*a* through 11*d* and an earth side of the optical waveguides 4 and 12. More than one loading of the laser chip 30 is earthed through the ground terminal 80. And it is not necessary to provide more than one reference potential terminal.

In addition, the optical semiconductor device is not limited to the SG-DR region, although the SG-DR region is used as the optical semiconductor device in the embodiments above. The optical semiconductor device may be other optical semiconductor device if having a heater controlling a temperature of an optical waveguide.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-096163 filed on Mar. 30, 2006, the entire disclosure of which is hereby incorporated by reference.

What is claimed is:

1. An optical semiconductor device comprising:
   a heater generating heat and provided on a first semiconductor region and has more than one heater segment coupled or separated to each other;
   an optical waveguide layer that is provided in the first semiconductor region and receives the generated heat from the heater,
   a first electrode that is coupled to a connecting point of the heater segments adjacent to each other; and
   second electrodes that are electrically common and are coupled to other ends of the heater segments in opposite side of the connecting point respectively,
   wherein the heater is a thin-film resistor.

2. The optical semiconductor device as claimed in claim 1, wherein at least a part of the first electrode and at least a part of the second electrode are insulated and laminated.

3. The optical semiconductor device as claimed in claim 1 further comprising another heater segment adjacent to the heater segment having one of the second electrodes,
   one end of the another heater segment being coupled to the second electrode,
   the other end of the another heater segment being coupled to a third electrode.

4. The optical semiconductor device as claimed in claim 3, wherein an electrical potential to be applied to the third electrode is different from that to be applied to the first electrode.

5. The optical semiconductor device as claimed in claim 3, wherein an electrical potential to be applied to the third electrode is the same as that to be applied to the first electrode.

6. The optical semiconductor device as claimed in claim 3, wherein the electrodes to which a common electrical potential is to be applied are coupled to a common pad on the optical semiconductor device.

7. The optical semiconductor device as claimed in claim 1, wherein the electrodes to which a common electrical potential is to be applied are coupled to a common pad on the optical semiconductor device.

8. The optical semiconductor device as claimed in claim 1, wherein a plurality of heater groups that have the heater segment, the first electrode and one of the second electrodes are provided.

9. The optical semiconductor device as claimed in claim 8, wherein the electrodes of the heater groups to which a common electrical potential is to be applied are coupled to a common pad on the optical semiconductor device.

10. The optical semiconductor device as claimed in claim 1, wherein the optical waveguide layer receiving the heat from the heater has a plurality of optical waveguide segments having a first region that has a diffractive grating and a second region that is a space region coupled to the first region.

11. The optical semiconductor device as claimed in claim 1, wherein:
 a plurality of heater groups that have the heater segment, the first electrode and one of the second electrodes are provided; and
 a plurality of optical waveguide segments having a first region that has a diffractive grating and a second region that is a space region coupled to the first region are provided according to the heater groups.

12. The optical semiconductor device as claimed in claim 1, wherein the optical waveguide layer is optically coupled to an optical waveguide layer of a gain region having a gain.

13. The optical semiconductor device as claimed in claim 1, wherein the first electrode and the second electrodes are made of a material different from that of the heater.

* * * * *